Dec. 6, 1960 G. J. GIEL 2,963,697

CODE CONVERSION SYSTEM

Filed Feb. 13, 1956

2 Sheets-Sheet 1

INVENTOR.
GEORGE J. GIEL
BY Byard G. Nilsson
ATTORNEY

Dec. 6, 1960 G. J. GIEL 2,963,697

CODE CONVERSION SYSTEM

Filed Feb. 13, 1956 2 Sheets-Sheet 2

INVENTOR.
GEORGE J. GIEL
BY
Byard G. Nilsson
ATTORNEY 2,963,697

CODE CONVERSION SYSTEM

George J. Giel, Los Angeles, Calif., assignor to The Bendix Corporation, a corporation of Delaware Filed Feb. 13, 1956, Ser. No. 564,914

4 Claims. (Cl. 340—347)

This invention relates to code conversion systems for converting electrical signals of one code to electrical signals of another code.

In electronic computing systems, telemetering systems, and certain other electrical systems, various numerical codes are utilized to represent numerical quantities. Numerical codes so utilized generally fall into two categories, i.e., analog and digital. In systems utilizing an analog code, numerical quantities are represented by the magnitude of a signal. In systems in which digital codes are used, discrete electrical signals in various arrangements are representative of different numerical values. Certain advantages are inherently present in systems using each of the above codes and it therefore often becomes desirable to utilize an analog code in one part of a system and a digital code in another part. To enable such an instance, it becomes necessary to convert numerical information from one code to another code.

The present invention provides a system for converting electrical signals representative of a first code into electrical signals of a second code. The operation of the system is periodically self-checked by running a test conversion on a known code value, and comparing the result of the test conversion with a standard. Variation between the result of the test conversion and the standard, of a predetermined amount, will then cause an error signal to be formed which may be utilized to manifest a malfunction in the operation of the conversion system or to alter the operation of the conversion system.

An object of the present invention is to provide an improved code conversion system.

Another object of this invention is to provide a code conversion system which incorporates an improved method of self-checking.

Other and incidental objects of this invention will be apparent to those skilled in the art from reading the following specification and on inspection of the accompanying drawings in which.

Figure 1:
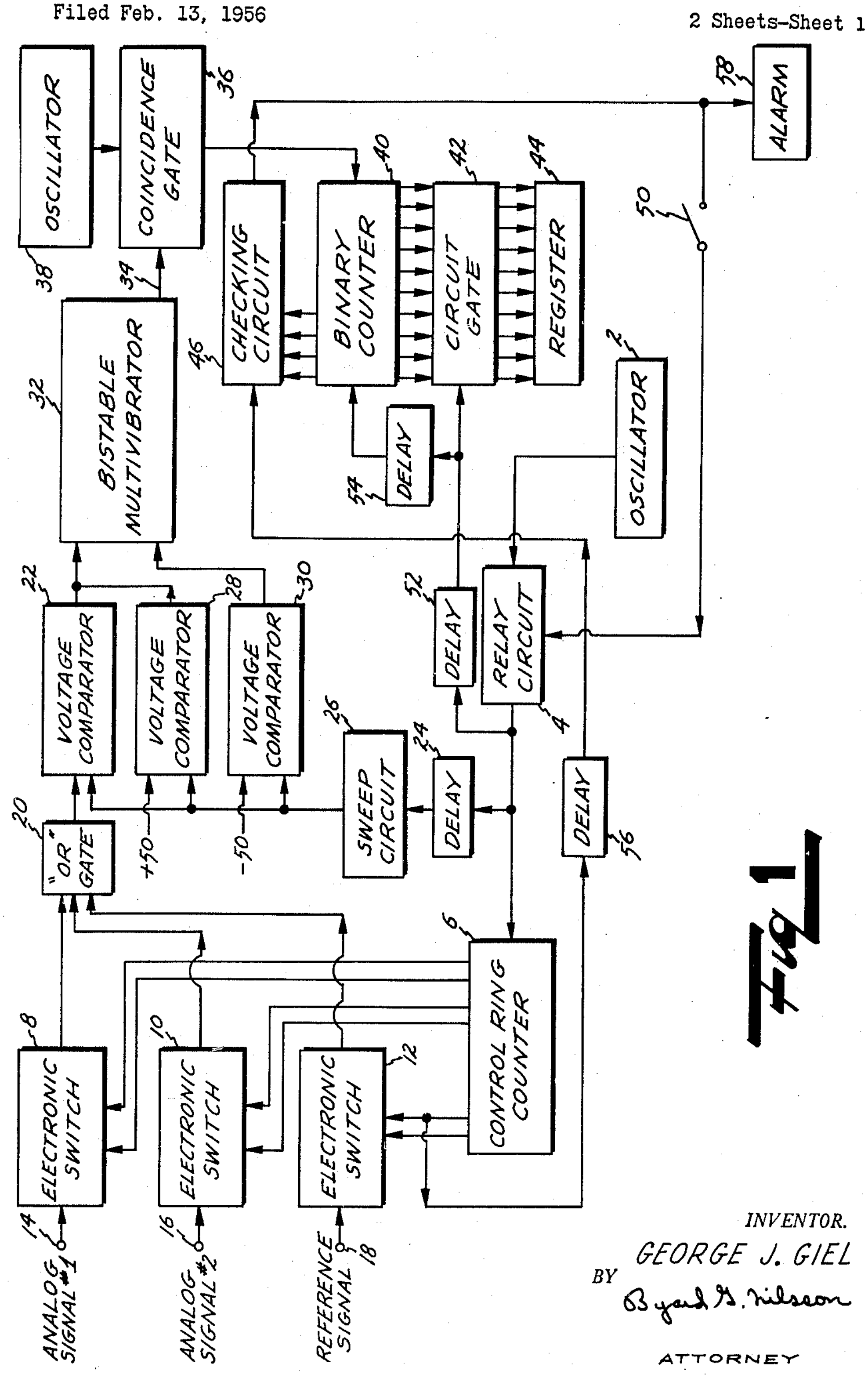
Figure 1 shows a block diagrammatic representation of a system constructed in accordance with this invention.

There is shown in Figure 1 an oscillator 2 which is free-running and which has a high degree of reliability. The oscillator 2 is coupled through a normally-closed relay circuit 4, to a control ring counter 6. Ring counters are well known and are described beginning on page 602 of volume 19 of the Radiation Laboratory Series, entitled, "Waveforms." The control ring counter 6 contains a number of two-state devices all but one of which, during normal operation, will have the same state. Each of the two-state devices in the control ring counter 6 is connected by means of pairs of lines to one of the electronic switches 8, 10, and 12. When a two-state device in the control ring counter 6 is in one state, one a pair of lines will carry a relatively high signal whereas the other line will carry a relatively low signal. Reversal of state will then reverse the signals on the pair of lines.

The electronic switches 8, 10, and 12, are capable of performing rapid switching operations to, at random time intervals, sample the signals applied at the terminals 14, 16, or 18. A system which may be utilized for the electronic switches 8, 10, or 12, will later be described in detail.

With the occurrence of a relatively high signal on one of the pairs of lines connecting one of the electronic switches to the control ring counter, the electronic switch will pass a signal. The occurrence of a high signal on another of the pair of lines will open the electronic switch.

The outputs from all of the electronic switches 8, 10, and 12, are coupled to an "or" gate circuit 20. The "or" gate circuit 20 serves to combine the time-shared signal outputs from the electronic switches 8, 10, and 12 into a single electrical signal. The "or" gate circuit 20 is coupled to a voltage comparator 22.

The electrical oscillations from the oscillator 2 which pass through the relay circuit 4 are also coupled to a delay circuit 24.

The delay circuit 24 effects a predetermined delay in the oscillations, after which the signals are passed to a sweep circuit 26. The sweep circuit 26 may be one of a number of types of keyed sweep generators which, upon receiving a keying signal, will form a sawtooth voltage.

The output from the sweep circuit 26 is coupled to voltage comparators 22, 28, and 30. The voltage comparators 28 and 30, receive for voltage comparison, reference voltages of +50 volts, and —50 volts respectively.

The voltage comparator circuits 22, 28, and 30, may be one of the well-known circuit devices which function to receive two voltages and form an impulse at a time when the two voltages received are of a similar magnitude. Such devices are shown and described in volume 19 of the Radiation Laboratories Series entitled, "Waveforms," beginning on page 335.

The ouput from the voltage comparator 30 is connected to one input terminal of a bi-stable multivibrator 32. The voltage comparators 22 and 28 are connected to another input terminal of the bi-stable multivibrator 32. An output of the multivibrator 32 is connected to a coincidence gate circuit 36 which requires the presence of two relatively high signals to pass a relatively high signal. The multivibrator 32 is so connected that upon receiving a signal from the voltage comparator 30, the state of the multivibrator 32 will be made such as to form a relatively high signal on the line 34, thereby qualifying the coincidence gate circuit 36. When the multivibrator 32 receives a signal from either of the voltage comparators 22 or 28, the state of the multivibrator 32 will be made such that a relatively low signal will appear on the line 34, and the coincidence gate circuit 36 will not be qualified. The coincidence gate circuit 36 is connected to gate signals from an oscillator 38 which oscillates at frequency somewhat higher than 1000 times that of the oscillator 2.

The coincidence gate 36 is connected to a binary counter 40, such that during the period when the gate 36 is qualified, oscillations from the oscillator 38 will be counted as pulses each representing one count, in the binary counter 40. The binary counter 40 will thus store a number in binary form, which indicates the number of pulses received during a counting interval. Binary counters are shown and described which may serve as the counter 40, beginning on page 194 of a book entitled, "Arithmetic Operations in Digital Computers," by R. K. Richards, published by D. Van Nostrand Co. The binary counter 40 has a plurality of outputs, i.e., one for each digit position of numbers which may be accumulated in the counter 40. The outputs from the binary counter 40 are connected to a coincidence gate circuit 42. The outputs from the gate circuit 42 which, upon qualification, are connected to a register 44 which may be of a magnetic tape type or the input register of a computer or other digital device.

Certain of the digit positions of the binary counter 40 are coupled to a checking circuit 46. The checking circuit 46 functions, on signal, to compare the numerical value represented by the signals received from the binary counter 40 with a standard range of values, and to derive a signal at a time when the value of the signals from the binary counter do fall within a predetermined range of values. A circuit which may be used as the checking circuit 46, will be described in detail later in the specification. The checking circuit 46 is connected to pass a signal to an alarm circuit 58 and through a manually operative switch 50 to the relay circuit 4 periodically as long as the conversion which is checked lies within a predetermined range of values.

The signal oscillations from the oscillator 2 after passing through the relay circuit 4 are also passed by direct connection to a delay circuit 52. After a predetermined delay, signals passing through the delay circuit 52 pass by direct connection to the gate circuit 42 and to a delay circuit 54 which incurs a further delay and then passes signals, by direct connection, to a reset connection of the binary counter 40. The checking circuit 46 is connected to the control ring counter 6 through a delay circuit 56 to receive an operation-commanding signal.

Consider now the mode of operation of the system shown in Figure 1. Broadly, the system functions to time sample analog signals number 1 and number 2, which appear at the terminals 14 and 16, and to convert such analog signals into digital signals. The operation of the converter is then periodically checked by performing a conversion of a reference signal of known value, and comparing the result with a standard. Consideration will first be made of the mode of operation without considering the checking operation.

During normal operation, the control ring counter 6 is periodically keyed by signals from the oscillator 2. During such a keying process, the high and low output signals on certain of the pairs of lines from the control ring counter 6 are reversed. For example, during one state of operation, the right line of each of the pairs of lines to the electronic switches 10 and 11 will receive a relatively high signal, whereas the left lines will receive an electrical signal of a relatively low value. During this interval, the signals appearing on the lines between the control ring counter 6 and the electronic switch 8, will be opposite, i.e., the left line receiving a relatively high signal, and the right line receiving a relatively low signal. Depending upon which of the left lines of a pair of lines from the control ring counter 6 receives a relatively high signal, a different one of the electronic switches 8, 10, and 12, will allow the passage of a signal from one of the terminals 14, 16, or 18, respectively to the "or" gate circuit 20.

It may therefore be seen that the "or" gate circuit 20 will sequentially receive: analog signal number 1, analog signal number 2, and the reference signal.

A short time after the change of state of the control ring counter 6, the sweep circuit 26 will be keyed into operation by a signal from the oscillator 2 which passes through the relay 4 and the delay circuit 24, to begin the generation of a sawtooth voltage wave. At a time when the sawtooth voltage wave beginning at some point below a value of —50 volts, crosses a value of —50 volts, the voltage comparator 30 will function to formulate an electrical pulse which will be passed to set the state of the bi-stable multivibrator 32 such as to cause a relatively high signal to be applied to the line 34, thereby maintaining the coincidence gate circuit 36 open or in a qualified state. During this interval when the coincidence gate circuit 36 is qualified, oscillations from the oscillator 38 will be passed to the binary counter 40 and be counted. As the sweep voltage continues to linearly increase in magnitude a time occurs when the voltage level of the signal from the "or" gate 20 is reached. At this instant, the voltage comparator 22 forms an electrical pulse which is passed to the bi-stable multivibrator 32 changing the state of the multivibrator 32 and thereby causing a relatively low signal to be applied to the line 34. The low signal on the line 34 effects a closure of the gate circuit 36. If for some reason the signal from the "or" gate 20 is not received by the voltage comparator 22, or has passed out of range, then when the sweep signal from the sweep circuit 26 reaches +50 volts, the state of the multivibrator will be altered.

At the instant when the gate circuit 36 is closed, the pulses from the oscillator 38 will be stopped and no further counting will occur in the binary counter 30.

It may therefore be seen, that counting in the binary counter 40 occurs for an interval beginning with the time when the sweep voltage from the sweep circuit 26 reaches a —50 volts, and ends at a time when the voltage from the sweep circuit 26 reaches the value of the voltage sample from the "or" gate 20.

Figure 2:
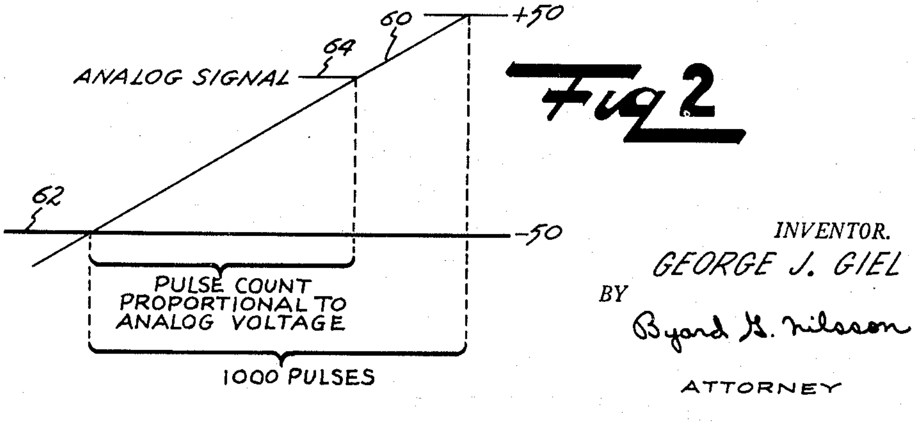
Figure 2 shows curves which illustrate a portion of the operation cycle of the system represented in Figure 1.

Reference to Figure 2 will illustrate the timing of the binary counter 40. There is shown in Figure 2 a line 60 representative of a voltage-time plot of the sweep voltage from the sweep circuit 26. A line 62 is representative of the potential level of —50 volts. At the instant when the line 60, i.e., the sweep voltage, crosses the line 62, i.e., potential level of —50 volts, the binary counter 40 will begin counting at a uniform rate. At the time when the sweep voltage as represented by the line 60, crosses the line 64, representing the magnitude of the analog signal from the "or" gate 20, the counting in the binary counter 40 will be halted.

It may therefore be seen that by reason of the fact that the binary counter 40 receives impulses at a uniform rate from the oscillator 38, and therefore counts at a uniform rate, the number to which the binary counter will count is dependent upon the interval of counting, i.e., the interval when the coincidence gate 36 is open. The period during which the coincidence gate circuit 36 is open, is in turn determined by the magnitude of the voltage appearing at the output from the "or" gate 20. That is, due to the fact that the sweep circuit 26 generates a linearly increasing voltage, the time interval between the instant when the linear sweep voltage crosses —50 volts, and the instant when the sweep voltage crosses the value of the analog voltage, will be directly proportional to the magnitude of the sampled analog voltage.

It may therefore be seen, that the value counted in the binary counter 40 will be directly proportional to the magnitude of the analog signal appearing at the output from the "or" gate circuit 20. The full-scale sweep period, after which the voltage comparator 24 will inhibit the gate circuit 36, if no analog voltage appears at the voltage comparator 22, extends to a value of +50 volts. It may therefore be seen, that the full scale of conversion extends from a voltage level of —50 volts to a voltage level of +50 volts and thereby encompasses a range of 100 volts. The slope of the sawtooth wave from the sweep circuit 26, is such that during the time interval when the voltage magnitude passes from —50 to +50 volts, 1,000 oscillations will occur from the oscillator 38. It may therefore be seen that 1,000 different resolutions may be made of an analog voltage which is being converted to a digital code value. Of course, the values of range and reference signal are only illustrative, and could be varied to any values.

Consider now the accomplishment of an actual conversion. Assume for example, that the electronic switch 8 is operated to sample an analog signal representative of a value of 750, i.e., +25 volts. A brief interval thereafter the oscillation from the oscillator 2 which triggered the control ring counter will have passed through the delay circuit 24 and triggered the sweep circuit 26. The sweep circuit 26 will then form a voltage the magnitude of which begins at a level below −50 volts and linearly increases. When this sweep voltage crosses the level of −50 volts, the voltage comparator 30 will generate a pulse to set the state of the multivibrator 32 to cause a high signal to be applied to the coincidence gate circuit 36, qualifying the circuit 36 to allow the passage of oscillations from the oscillator 38 into the binary counter circuit 40.

The value of +25 volts which was sampled by the electronic switch 8, is passed through the "or" gate circuit 20 to act as a reference voltage for the voltage comparator 22. At a time when the sweep voltage from the sweep circuit 26 crosses the voltage of +25 volts, the voltage comparator 22 will generate a pulse to set the multivibrator 32 to a state in which the voltage appearing on the line 34 is relatively low to close the coincidence gate 36. This occurs after the sweep voltage from the sweep circuit 26 has traversed ¾ of full scale, i.e., from −50 volts, to +25 volts. The binary counter 40 has during this time interval, i.e., ¾ of the full-scale time interval, counted to a value of 750. During the full-scale time interval, the binary counter 40 would have counted to a value of 1,000. The binary counter 40 therefore now holds in digital form the value, 750, coinciding to the value of the analog signals sampled by the electronic switch 8.

The oscillation from the oscillator 2 after passing through the relay 4 and the delay circuit 52 is now received by the gate circuit 42 qualifying the gate circuit 42 to couple the binary counter 40 to the register 44, such that the content of the counter 40 now becomes recorded in the register 44.

The same oscillation which qualified the gate circuit 42 is passed through the delay circuit 54 to the binary counter 40 and serves to reset the counter 40 back to zero.

Consideration will now be made of the operation of the system of Figure 1 during a checking interval. During a checking interval, the electronic switch 12 will be rendered operative by the control ring counter 6, and the reference signal at terminal 18 will be sampled. For purposes of illustration, assume that the value of the reference signal is zero volts. The zero volt level signal will be passed through the "or" gate 20 to the voltage comparator 22.

The multivibrator circuit 32 will have opened the gate circuit 36, as previously described, at the instant when the signal from the sweep circuit 26 crossed the potential level of −50 volts. The multivibrator circuit 32 will remain open until such time as the sweep circuit 26 reaches a potential level at which time the voltage comparator 22 will formulate a pulse to alter the state of the multivibrator 32, thereby closing the gate circuit 36.

It may therefore be seen, that the multivibrator has been in such a state as to qualify the gate circuit 32 for one-half of the full scale period, i.e., from −50 volts to zero volts. During such an interval, 500 counts from the oscillator circuit 38 should have entered the binary counter circuit 40 to count to a value of 500. The signal appearing on the left line of the pair of lines connecting the control ring counter to the electronic switch 12 is also coupled to the delay circuit 56 which is in turn coupled to the checking circuit 46. Therefore, after a sufficient delay period, during which period the counting occurs, a signal will be passed from the delay circuit 56 to the checking circuit 46. At the instant when the checking circuit 46 receives the signal from the delay circuit 54, a comparison will be made between certain digits of the value registered in the binary counter 40, and the digits which should be registered in the binary counter 40. That is, as a known signal is sampled by the electronic switch 12, a known digital code value should now be standing in the binary counter 40. Any number of digit positions which form the numerical value standing in the binary counter 40 may be coupled to the checking circuit 46 to be checked, however, it may be sufficient to check less than the full number of digit positions, as for example 4-digit positions may be sufficient. The justification for checking only 4-digit positions lies in the substantial reduction of circuitry, coupled with the fact that errors which are made which result in converted digital values having the same four least significant digits, are extremely unlikely, particularly in a repetitive fashion.

The coincidence circuit 46 is so constructed that if the four least significant digits of the number contained in the accumulator circuit 40 which should be 500, are similar to the four least significant digits in the values 499, 500, or 501, then a signal will be generated by the coincidence circuit 46 at its output. If, however, one of these values is not present in the accumulator circuit 40, the coincidence circuit 46 will not generate a signal to be passed to the alarm circuit 58 and the alarm circuit 58 will make this known. The alarm circuit 50 may be either of an audio or visual type, and contains for example a delay relay, which, if not pulsed periodically, will activate an alarm to indicate the occurrence of an error greater than one part in 500. The output of the coincidence circuit 46 may also be coupled to the relay circuit 4 when the manually operated switch 50 is closed, and upon the absence of the check pulses the relay circuit 4 will open and no further oscillations will be permitted to pass to institute further conversions.

It is to be noted that the degree of error which will be tolerated in the system may be varied by varying the circuitry of the coincidence circuit 46 in a manner as will be explained later.

It is further noteworthy that if the sampling performed is of a return-to-reference type wherein the samples result in a signal which returns to a reference level, then the zero may be used as a reference signal and no sampling of a reference signal is necessary. It is only necessary to provide a period when the signal remains at reference level.

Figure 3:
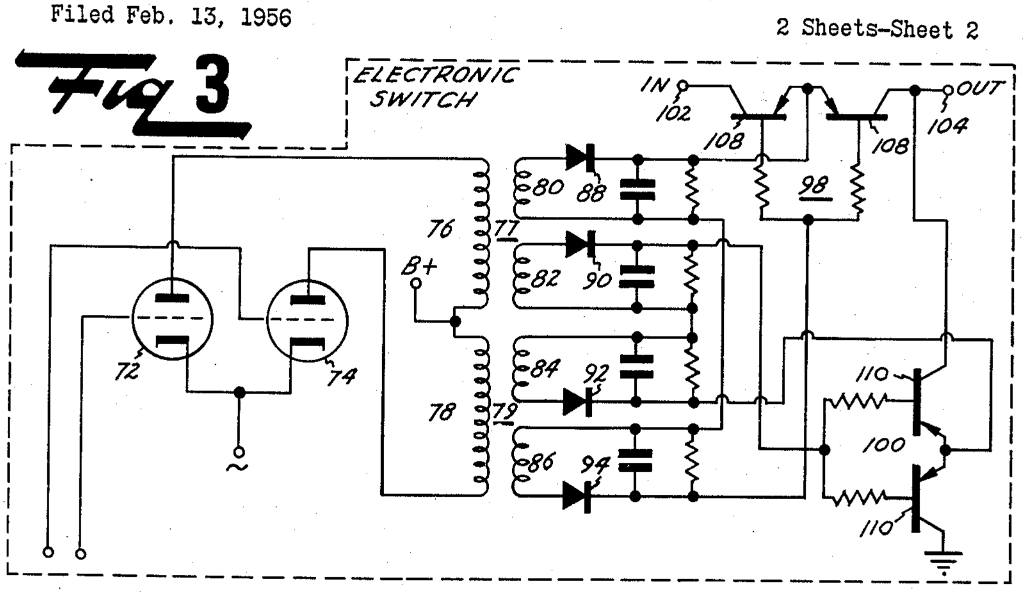
Figure 3 shows a circuit diagrammatic representation of an electronic switch which may be used in the system represented in Figure 1.

Reference will now be had to Figure 3 for an explanation of a circuit which may be used as the electronic switches 8, 10, and 12. There are shown in Figure 3, triodes 72 and 74. The grids of the triodes are connected to the control ring counter 6 of Figure 1, such that one of the grids will always receive a relatively high signal, and the other of the grids will always receive a relatively low signal. The cathodes of both the triodes 72 and 74 are connected to a source of alternating potential. The plates of the triodes 72 and 74 are connected respectively through the primary windings 76 and 78 of two transformers 77 and 79 to a source of positive potential B+. The primary winding 76 is inductively coupled to secondary windings 80 and 82. The primary winding 78 is inductively coupled to secondary windings 84 and 86. The secondary windings 80, 82, 84, and 86, are connected respectively to rectifiers 88, 90, 92, and 94. The outputs from the rectifiers 88, 90, 92, and 94, are connected to provide different biasing currents to transistor switches 98 and 100. The transistor switch 98 is connected between an input terminal 102 and an output terminal 104. The transistor switch 100 is connected between the output terminal 104 and ground.

At a time when the transistor switch 98 becomes an open circuit, the transistor switch 100 due to the arrangement of the secondary windings 80, 82, 84, and 86, will provide a low resistance current path between the output terminal 104 and ground potential. Similarly, when the transistor switch 100 is open to isolate the output terminal 104 from ground, the transistor will form a low resistance connection between the input terminal 102 and the output terminal 104. The determination of which of the above described states exists, is dependent upon which of the triodes 72 or 74 is rendered conductive. Assume for example, that the triode 72 is rendered conductive. During this interval, an alternating current will pass through the triode 72, and the primary winding 76. Such an alternating current in the primary winding 76, will inductively energize the secondary windings 80 and 82. The voltages so induced in the secondary windings 80 and 82 will be rectified by the rectifiers 88 and 90, and applied respectively to emitter elements 108 of the transistor switch 98, and to base elements 110 of the transistor switch 100. The transistor switches 98 and 100 are such that if potential is applied such as to cause a current to flow from emitter to base elements, the switch will be opened, however, if a current is caused to flow from the base elements to the emitter elements, the transistor switches will be closed. It may therefore be seen, that when the winding 76 is energized, the transistor switch 108 will be opened and the transistor switch 110 will be closed.

The reverse state of the transistor switches 98 and 100 occurs when the winding 78 is energized, which occurs when the triode 74 is rendered conductive and the triode 72 is not conductive.

Figure 4:
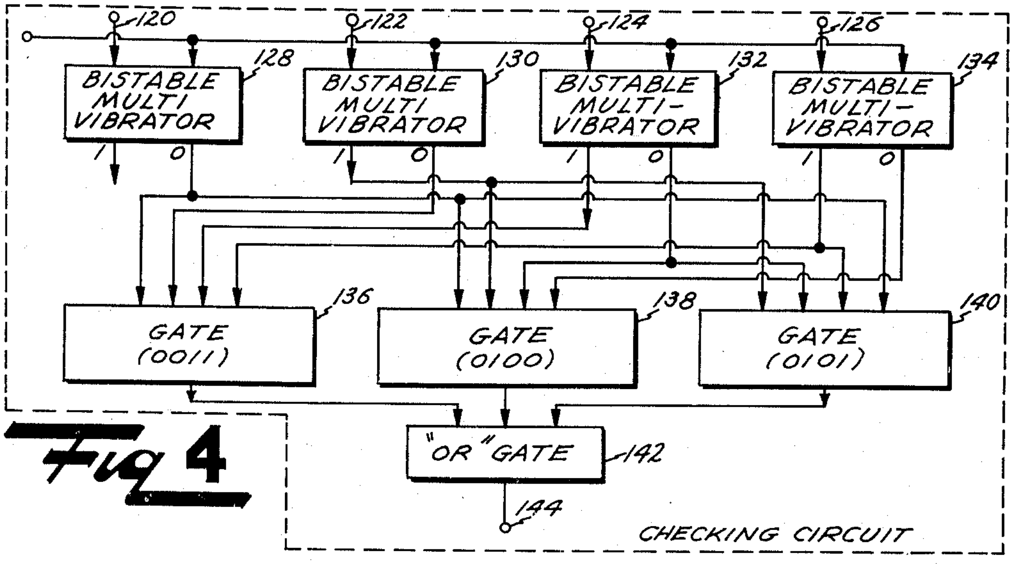
Figure 4 shows a block diagrammatic representation of an electronic checking circuit which may be utilized in the system represented in Figure 1.

Reference will now be had to Figure 4 which shows a block diagrammatic representation of a system which may be used as the checking circuit 46 of Figure 1. The checking circuit 46 of Figure 1, receives four input signals from the binary counter 40, these input signals are applied respectively to the terminals 120, 122, 124, and 126, of Figure 4. The terminals 120, 122, 124, and 126, of Figure 4, are coupled to bi-stable multivibrators 128, 130, 132, and 134, the outputs of which are connected in various arrangements to coincidence gate circuits 136, 138, and 140. The gate circuits 136, 138, and 140, are coupled to an "or" circuit 142. The coincidence gate circuits 136, 138, and 140, require that all the input lines to a gate carry a high signal in order to pass a high signal. Gate circuits for performing this function are well known in the prior art and are therefore not deemed to require detailed description. Various forms of such gate circuits are shown and described in a book entitled "Automatic Digital Calculators" by Booth and Booth, published in 1953 by Butterworths Scientific Publications, beginning on page 9. During a checking interval, the bi-stable multivibrators 128, 130, 132, and 134, will be set up with the four least significant digits of the numerical value contained in the binary counter 40. If more digits are to be checked, more multivibrators will be provided. Each of the bi-stable multivibrators 128, 130, 132, and 134, are capable of having two states which are indicated by one of two outputs from the multivibrators having a relatively high voltage value. One of the outputs when high is indicative of a 1-digit, the other, when high, is indicative of an 0-digit. For example, if the value in the binary counter 40 is 499, the multivibrator circuits 128, 130, 132, and 134, would respectively store the digits 0011, i.e., the four least significant digits of the binary number 499. If the bi-stable multivibrators 128, 130, 132, and 134, do store the digits 0011, the coincidence gate circuit 136 is so connected to the multivibrators 128, 130, 132, and 134, as to be qualified and a signal will be passed to the "or" gate 142 which will, in turn, pass the signal to a terminal 144.

In the event that the numerical value contained in the binary counter 40 is 500, the four least significant digits in the binary counter will be 0100. These digits 0100 will be placed in the bi-stable multivibrator circuits 128, 130, 132, and 134, such that the coincidence gate circuit 138 will be qualified and the signal will be passed to the "or" gate 142. The occurrence of the number 501 in the binary counter 140 will cause the multivibrator circuits 128, 130, 132, and 134, to contain the digits 0101. The occurrence of such a condition, will qualify the coincidence gate 140, thereby passing a signal to the "or" gate 142. In the event that the "or" gate 142 receives a signal by any of the above described means, the relay 4 and the alarm circuit 58 will be maintained, however, if no signal appears at the terminal 144, then the alarm circuit 58 and the relay circuit 4 will not receive a holding pulse signal and will be operative.

It may therefore be seen that applicant has provided a conversion system, for converting first code signals representative of a numerical value, to other code signals representative of the same numerical value, wherein the system is periodically self-checking. The occurrence of an error in the self-checking system, is automatically manifested and the circuit may be disabled from performing further conversions, until a check is made of the circuitry.

What is claimed is:

1. An analog-digital conversion system comprising: conversion means for converting signals from an analog form to a representative digital form and including a counting circuit for counting in predetermined increments at regular intervals during a period determined by the value of said analog signal; means for applying analog information signals to said conversion means during certain intervals; means for applying analog reference signals representative of a predetermined value to said code conversion means during other intervals; means for detecting the degree of variation from the represented value by digital signals resulting from said analog reference signals applied to said code conversion means during said other intervals; and means for changing the operation of said conversion means at a time when the degree of variation exceeds a predetermined amount.

2. A code conversion system wherein analog signal representations are converted into digital signal representations comprising: first and second sampling means, each including a transformer having a plurality of secondary windings and semiconductor switching devices connected to the secondary windings of said transformer whereas said secondary windings provide biasing currents to said semiconductor switching devices, and means for selectively energizing various of said secondary windings, said first sampling means for sampling said analog signal during predetermined intervals to form analog information samples; said second sampling means for sampling a reference signal value during other intervals to form analog reference samples; conversion means connected to receive said samples for converting said samples into representative digital signals; means connected to selectively receive said digital signals representative of said reference samples for forming an error signal at a time when said digital signals representative of said reference sample do not indicate a predetermined range of digital signal values; and means operative by said error signal for indicating the occurrence of said error signal.

3. A code conversion system wherein analog signal representations are converted into digital signal representations comprising: first sampling means for sampling said analog signal during predetermined intervals to form analog information samples; second sampling means for sampling a reference signal value during other intervals to form analog reference samples; conversion means connected to receive said samples for converting said samples into representative digital signals; a plurality of gate circuits differently connected to receive representations of certain digits of said digital signals representative of said reference samples, for forming an error signal at a time when said digital signals representative of said reference samples do not indicate a predetermined range of digital signal values; and means operative by said error signal for indicating the occurrence of said error signal.

4. An analog-digital code conversion system comprising: conversion means for converting analog signals into digital code signals; first and second means for applying signals to said conversion means, each including a transistor switch, a transformer having plural secondary windings, different of which are connected to said transistor switch so that said switch may be differently biased through different of said secondary windings, and means for selectively energizing said secondary windings, said first means for applying said analog signals to said code conversion means during certain intervals, and said second means for applying analog signals representative of a predetermined value to said conversion means during other intervals; means for detecting the degree of variation from the represented value of said digital signals resulting from said analog signals applied to said code conversion means during said other intervals; and means for manifesting the occurrence of a time when the degree of variation exceeds a predetermined value.

References Cited in the file of this patent

UNITED STATES PATENTS

| | | |
|---|---|---|
| 2,326,313 | Trucksess | Aug. 10, 1943 |
| 2,564,692 | Hoeppner | Aug. 21, 1951 |
| 2,611,026 | Blanton | Sept. 16, 1952 |
| 2,641,696 | Woolard | June 9, 1953 |
| 2,734,188 | Jacobs | Feb. 7, 1956 |
| 2,739,301 | Greenfield | Mar. 20, 1956 |
| 2,753,546 | Knowles | July 3, 1956 |
| 2,787,418 | MacKnight et al. | Apr. 2, 1957 |